United States Patent

Grehl et al.

[11] Patent Number: 5,986,491
[45] Date of Patent: Nov. 16, 1999

[54] CLOCK SIGNAL GENERATOR

[75] Inventors: Udo Grehl, München; Achim Dallmann, Baldham, both of Germany

[73] Assignee: Siemens Aktiengesellschaft, Munich, Germany

[21] Appl. No.: 09/188,046

[22] Filed: Nov. 6, 1998

Related U.S. Application Data

[63] Continuation of application No. PCT/DE97/00775, Apr. 17, 1997.

[51] Int. Cl.$^6$ .................................................. H03H 11/16
[52] U.S. Cl. ........................... 327/239; 327/175; 327/250
[58] Field of Search ................................... 327/239, 250, 327/251, 256, 257, 258, 259, 171, 172, 173, 174, 175, 176, 291, 295

[56] References Cited

U.S. PATENT DOCUMENTS

| | | | |
|---|---|---|---|
| 4,417,158 | 11/1983 | Ito et al. ................................... | 327/295 |
| 4,675,546 | 6/1987 | Shaw ....................................... | 327/176 |
| 4,939,677 | 7/1990 | Otuji et al. ............................... | 364/569 |
| 5,086,236 | 2/1992 | Feemster ................................. | 327/144 |
| 5,306,959 | 4/1994 | Knauf et al. ............................. | 327/292 |
| 5,453,707 | 9/1995 | Hiratsuka et al. ........................ | 326/97 |
| 5,532,633 | 7/1996 | Kawai ...................................... | 327/174 |
| 5,652,535 | 7/1997 | Kim et al. ................................ | 327/259 |

FOREIGN PATENT DOCUMENTS

| | | |
|---|---|---|
| 0183875A2 | 6/1986 | European Pat. Off. . |
| 0431761A2 | 6/1991 | European Pat. Off. . |
| 0579855A1 | 1/1994 | European Pat. Off. . |
| 0606912A2 | 7/1994 | European Pat. Off. . |

OTHER PUBLICATIONS

Japanese Patent Abstract No. 03204222 (Chiori et al.), dated Sep. 5, 1991.
Japanese Patent Abstract No. 01068016 (Masaru et al.), dated Mar. 14, 1989.
Japanese Patent Abstract No. 0212427 (Chiori), dated May 11, 1990.

*Primary Examiner*—Kenneth B. Wells
*Assistant Examiner*—Hai L. Nguyen
*Attorney, Agent, or Firm*—Herbert L. Lerner; Laurence A. Greenberg

[57] ABSTRACT

The clock signal generator can be used to generate a first and/or a second output clock signal from an input clock signal. The rising and/or falling edges of the input clock signal are shifted using delay stages. The clock signal generator has a delay stage with a plurality of delay elements that are wired up in parallel and that have different delay lengths, and a selection device that is used to determine which of the output signals from the delay elements is to be output as the output signal of the delay stage.

6 Claims, 2 Drawing Sheets

CLOCK SIGNAL GENERATOR

CROSS-REFERENCE TO RELATED APPLICATION

This is a continuation of copending International Application PCT/DE97/00775, filed Apr. 17, 1997, which designated the United States.

BACKGROUND OF THE INVENTION

FIELD OF THE INVENTION

The invention lies in the electronics field. Specifically, the present invention relates to a clock signal generator in which the duty ratio of the clock signals produced is programmable.

A clocked logic circuit has been disclosed, for example, in U.S. Pat. No. 4,719,365 to Misono (European EP 0 183 875 A). That device, however, is not suitable for producing clock signals of the type to which the invention pertains.

Clock signal generators of the known type are used, amongst other things, for controlling master/slave registers and the like, for example. Master/slave registers contain two storage elements connected in series, namely a so-called master store and a so-called slave store, which are controlled using two mutually different clock signals. More precisely, the first clock signal determines the instant at which any data present are transferred to the master store, and the second clock signal determines the instant at which data stored in the master store are transferred to the slave store.

Data may generally be transferred from the master store to the slave store only when the clock signal controlling the master store has assumed a state which prevents data from being written to the master store. If this were not the case, the data stored in the master store would still be able to change while being transferred to the slave store, which should normally be avoided if possible.

Consequently, the first clock signal and the second clock signal must never simultaneously be in a state which allows data to be transferred to the respective store. This can be achieved, for example, by generating the second clock signal by inversion of the first clock signal, so that the clock signals have essentially complementary waveforms. Clock signals generated in this manner are, in principle, suitable for controlling master/slave systems and the like.

However, on account of signal delay times, component tolerances, and the like, the above-mentioned overlaps in the signal waveforms, which are to be avoided, may nevertheless occur with the clock signals. This is undesirable and a serious problem, particularly at high clock frequencies and with stores responding at a correspondingly fast rate.

In order to avoid this, it is possible to process the mutually inverse clock signals in such a manner that a so-called overlap-free phase is imposed between the respective active phase of one clock signal and the subsequent active phase of the other clock signal. Both clock signals are in an inactive phase, for example a low-level phase, during the overlap-free phase.

Such an overlap-free phase can be provided (while maintaining the respective clock frequencies) by appropriately shifting the rising and/or falling edges of the first and/or of the second clock signal. This can be achieved using appropriate delay stages. See, for example, U.S. Pat. No. 5,453,707 to Hikichi (European EP 0 606 912 A).

Even though the use of such clock signals matched to the supposed conditions generally permits master/slave registers and the like to be driven considerably more reliably, there are nevertheless repeatedly cases, in practice, in which master/slave registers or the like cannot be operated correctly, despite the provision of the measures. This necessitates research into the cause and requires the relevant circuit or its affected circuit parts to be redesigned, which processes are frequently very extensive and correspondingly costly.

The same also applies to the case where the duty ratio of the clock signals used is responsible for the master/slave registers or the like operating incorrectly. In that case, too, matching to the supposed conditions does not automatically lead to the correct operation of the master/slave registers.

SUMMARY OF THE INVENTION

It is accordingly an object of the invention to provide a clock signal generator, which overcomes the above-mentioned disadvantages of the heretofore-known devices and methods of this general type and which allows the proper and correct operation of master/slave registers or the like which are controlled by the clock signals of the clock signal generator at all times.

With the foregoing and other objects in view there is provided, in accordance with the invention, a clock signal generator, comprising:

a clock input;

a first logic configuration having an input receiving an intermediate clock signal and outputting a first clock output signal;

a second logic configuration having an input receiving the intermediate clock signal and outputting a second clock output signal;

the first and second clock signals having a programmable duty ratio and a programmable overlap-free time;

a first delay stage with a selectable delay connected to receive the second clock output signal and to supply the second clock output signal to the first logic configuration;

a second delay stage with a selectable delay connected to receive the first clock output signal and to supply the first clock output signal to the second logic configuration;

a third delay stage with a selectable delay, the third delay stage having an input connected to the clock input; and a third logic configuration having an input connected to the clock input and outputting the intermediate clock signal to the input of the first logic configuration and to the input of the second logic configuration.

In accordance with an added feature of the invention, a multiplexer selects a delayed signal. The multiplexer is connected to a multiplicity of mutually parallel delay paths and it is controllable by an external control signal.

In accordance with an additional feature of the invention, a delayed signal is selectable by modifying a wiring of the multiplicity of parallel delay paths.

In accordance with another feature of the invention, a delayed signal is selectable by subsequently breaking wiring connections in the circuit with the multiplicity of parallel delay paths. The wiring connections are preferably broken by means of a laser beam.

In accordance with a concomitant feature of the invention, the third logic circuit has an AND gate and an OR gate each having a first input receiving the clock input signal and a second input receiving the signal delayed in the third delay stage, and wherein the intermediate clock signal is selectively tapped off at an output of the AND gate and an output of the OR gate.

In other words, the basic principle of the invention is found in the advantageous provision of a delay stage with a plurality of delay elements, which are wired up in parallel and have different delay lengths, and of a selection device which can be used to determine which of the output signals from the delay elements is to be output as the output signal of the delay stage.

This makes it possible to match, individually, the length of the active phases and of the inactive phases of the respective clock signals and the length of the overlap-free phases to the respective actual circumstances. These adjustments are possible even after the clock generator and the circuit to be driven by it have been produced, which means that the equipment which is to be driven by the clock signal generator according to the invention can be operated optimally in all cases.

If the clock signal generator according to the invention is used as a clock signal generator which is to be provided in an integrated circuit in order to drive the master/slave registers or the like which are also provided in the circuit, then malfunctioning of the integrated circuit—which is caused by the master/slave registers not being driven correctly and whose rectification, in the past, often required the integrated circuit to be completely redesigned—can frequently be eliminated simply by operating the clock signal generator, more specifically its delay stage(s) and/or its selection device(s), in an appropriately modified manner.

The invention thus provides for a clock signal generator by means of which master/slave registers or the like that are controlled by the clock signals of the clock signal generator can easily be operated correctly all the time.

Other features which are considered as characteristic for the invention are set forth in the appended claims.

Although the invention is illustrated and described herein as embodied in a clock signal generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
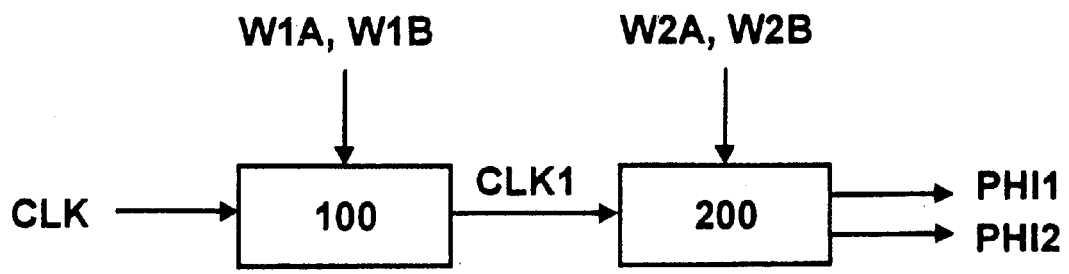
FIG. 1 is a block diagram showing the basic layout of an exemplary embodiment of the clock signal generator according to the invention.

Referring now to the figures of the drawing in detail and first, particularly, to FIG. 1 thereof, there is seen a clock signal generator that comprises two blocks, namely a first block 100 and a second block 200.

The task of the clock signal generator under consideration is to generate a first output clock signal PHI1 and a second output clock signal PHI2 from an input clock signal CLK. The output signals PHI1 and PHI2 drive a master/slave register or the like.

It will be understood by those skilled in the pertinent art that the use of the clock signal generator according to the invention is not restricted to the use described for driving master/slave registers and the like. Instead, the invention can be used wherever one or more clock signals are to be generated or provided which are in each case optimally matched to their application.

The first block 100 receives the input clock signal CLK as input signal and outputs an output signal (intermediate clock signal) CLK1, whose duty ratio is modified—if necessary—with respect to that of the input clock signal CLK. Whether and to what extent the original duty ratio is modified is determined by control signals W1A and W1B, which are input externally into the first block 100. The internal design of the first block 100. The effect of the control signals will be described in detail below with reference to FIG. 2.

The second block 200 receives the output signal (intermediate clock signal) CLK1 from the first block 100 as input signal and outputs the first (PHI1) output clock signal and the second (PHI2) output clock signal as output signals. These signals having essentially complementary amplitude waveforms at first and—if necessary—are additionally modified in terms of the duration of the overlap-free phase already mentioned in the introduction. Whether and to what extent an originally non-existent overlap-free phase (in the case of signals with exactly complementary waveforms, the overlap-free phase is always equal to zero) is generated is determined by control signals W2A and W2B, which are input externally into the second block 200. The internal design of the second block 200 and the effect of the control signals will be described in detail in the following text with reference to FIG. 3.

The first block 100 will now be described in more detail with reference to FIG. 2.

Figure 2:
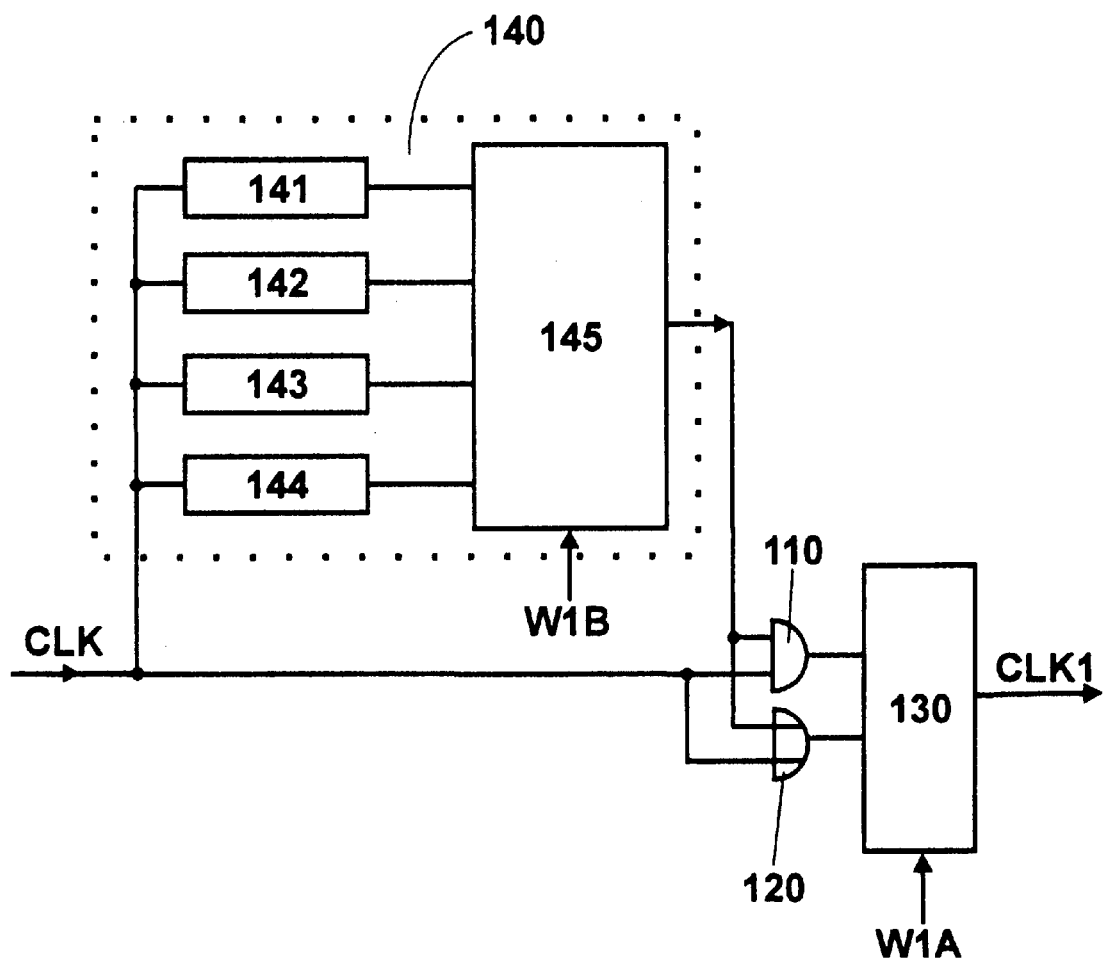
FIG. 2 is a schematic block diagram illustrating a possible embodiment of the first block 100 shown in FIG. 1.

The first block comprises an AND gate 110, an OR gate 120, a first multiplexer 130 and a delay stage 140, which are connected as shown in FIG. 2.

The core element of the circuit shown in FIG. 2 is the delay stage 140.

If this delay stage 140 were to be replaced by a continuous conduction element, the input signal CLK input into the first block 100 and the output signal CLK1 output from the first block would be entirely identical, specifically irrespective of whether the multiplexer 130, which can be driven by the signal W1A, is outputting the output signal from the AND gate 110 or the output signal from the OR gate 120 as output signal CLK1. This is because, in this case, both the signals input into the AND gate 110 and the signals input into the OR gate 120 would be exactly identical at any chosen instant, namely the same as the input signal CLK input into the first block 100.

In contrast to this, as a result of the delay stage 140 being provided, the AND gate 110 and the OR gate 120 can each receive one of their input signals offset in time, which, as can be seen, results in the rising or falling edges of the output signal CLK1 being shifted in time. In more precise terms, when the output signal from the AND gate 110 is used as the output signal CLK1 from the multiplexer 130 (and from the first block 100), its edges are shifted in such a manner that the signal rises to the high level later or drops to the low level sooner than is the case with the input signal CLK, which results in the high-level phase being shortened (the low-level phase being lengthened), i.e. the duty ratio is changed. On the other hand, when the output signal from the OR gate 120 is used as the output signal CLK1 from the multiplexer 130 (and from the first block 100), its edges are shifted in such a manner that the signal rises to the high level sooner or drops to the low level later than is the case with the input signal CLK, which results in the high-level phase being lengthened (the low-level phase being shortened), i.e. the duty ratio is likewise changed.

The extent to which the duty ratio is changed is determined by the extent of the delay by the delay stage 140. According to the invention, the latter is thus designed in such a way that it has a multiplicity of delay elements 141 to 144, connected in parallel, and a selection device in the form of a second multiplexer 145. The plurality of delay elements 141 to 144 are designed in such a way that they can be used to produce delays, for the signals input in each case, which can be defined as required but which are different from one another; in so doing, it may also be permitted for a delay to be equal to zero, that is to say for there to be no delay. All the delay elements receive one and the same input signal, namely the input clock signal CLK. This signal is delayed by the respective delay element according to the respective delay, but is output otherwise unchanged as the respective output signal from the respective delay element. The output signals from all delay elements 141 to 144 are input into the multiplexer 145.

The multiplexer 145 can be used to select or determine, as a function of the control signal W1B supplied externally, which of the signals input into the multiplexer 145 is to be output as the output signal of the latter (and at the same time of the delay stage 140).

The control signals W1A and W1B introduced externally into the first block 100 or into its multiplexers 130 and 145 thus enable the duty ratio of the input clock signal CLK to be set or purposefully changed, specifically both with regard to type (control signal W1A) and with regard to extent (control signal W1B).

The control signals W1A and W1B, i.e., their waveforms and/or values, may be stored in a memory unit, such as a register or the like, or may be permanently set by means of corresponding wiring.

Storage in a register or the like has the advantage that the corresponding values can then be (dynamically) changed at any time, that is to say even during operation. This enables particularly flexible matching to the respective circumstances, which is of considerable importance—particularly when taking account, as may be necessary, of conditions which vary with time, such as temperature, aging etc.—and, furthermore, also permits, among other things, automatic clock signal setting as part of a self-test of the circuit when it has been switched on or the like. The measures to be provided for storing appropriate initial values or updated values in the register or the like and the measures for using them as control signals W1A and W1B are known to those of skill in the art and do not require any further explanation.

Defining the control signals in such a way that they cannot subsequently be changed, for example by means of appropriate wiring, eliminates possible sources of error (by programming the clock signal setting incorrectly), protects against tampering and, under some circumstances, simplifies driving of the clock generator. One possibility for defining control signals in this manner in practice consists in destroying wiring which corresponds to unwanted clock signal settings and which is initially, i.e. after production of the relevant circuit or the relevant circuit part, still present intact. The appropriate connections may be broken, for example, using a laser beam, and should in this case be located at an easily accessible point. Another possibility for defining, in practice, the control signals such that they cannot subsequently be changed consists in omitting the connections which correspond to the unwanted clock signal settings as early as during the production stage; any changes which are subsequently found to be necessary can then be made with a minimum of effort (replacement of one connection with another), provided that the possibility of such modifications being needed was duly taken into account when the circuit was designed. A further possibility for defining, in practice, the control signals such that they cannot be changed consists in using a (if required, erasable) read-only memory (ROM, PROM, EPROM, EEPROM, flash EPROM) as a storage device for storing the waveforms and/or values for the control signals.

The common feature of all the possibilities for defining the control signals W1A and W1B such that they can or cannot be changed is that these control signals can be matched to the actual circumstances simply, that is to say at least without extensively redesigning the clock generator and/or the circuit, even after production of the clock generator and/or of the circuit to be driven by it. This matching can be optimal in each case, and not merely approximate. As already mentioned in the introduction, this is particularly advantageous for clock signal generators which are integrated in integrated circuits.

Although, in the exemplary embodiment under consideration, the control signals W1A and W1B can be used to influence the change in the duty ratio of the input clock signal CLK both with regard to type (control signal W1A) and with regard to extent (control signal W1B), there is no restriction on the provision of this (recurring) possibility for exerting an influence. This means that, if need be, one and/or other of these possibilities (omitting or including the corresponding circuit components) may be sacrificed.

The influence on the duty ratio which may be exerted using the control signals W1A and W1B enables, on its own or in conjunction with the ability to set the duration of the overlap-free phase, which is yet to be explained, extremely precise individual matching to the particular circumstances.

The second block 200 will now be explained in greater detail with reference to FIG. 3.

The second block 200 can be subdivided into two sub-blocks of largely identical design, namely a first sub-block for generating the first output clock signal PHI1, and a second sub-block for generating the second output clock signal PHI2.

Figure 3:
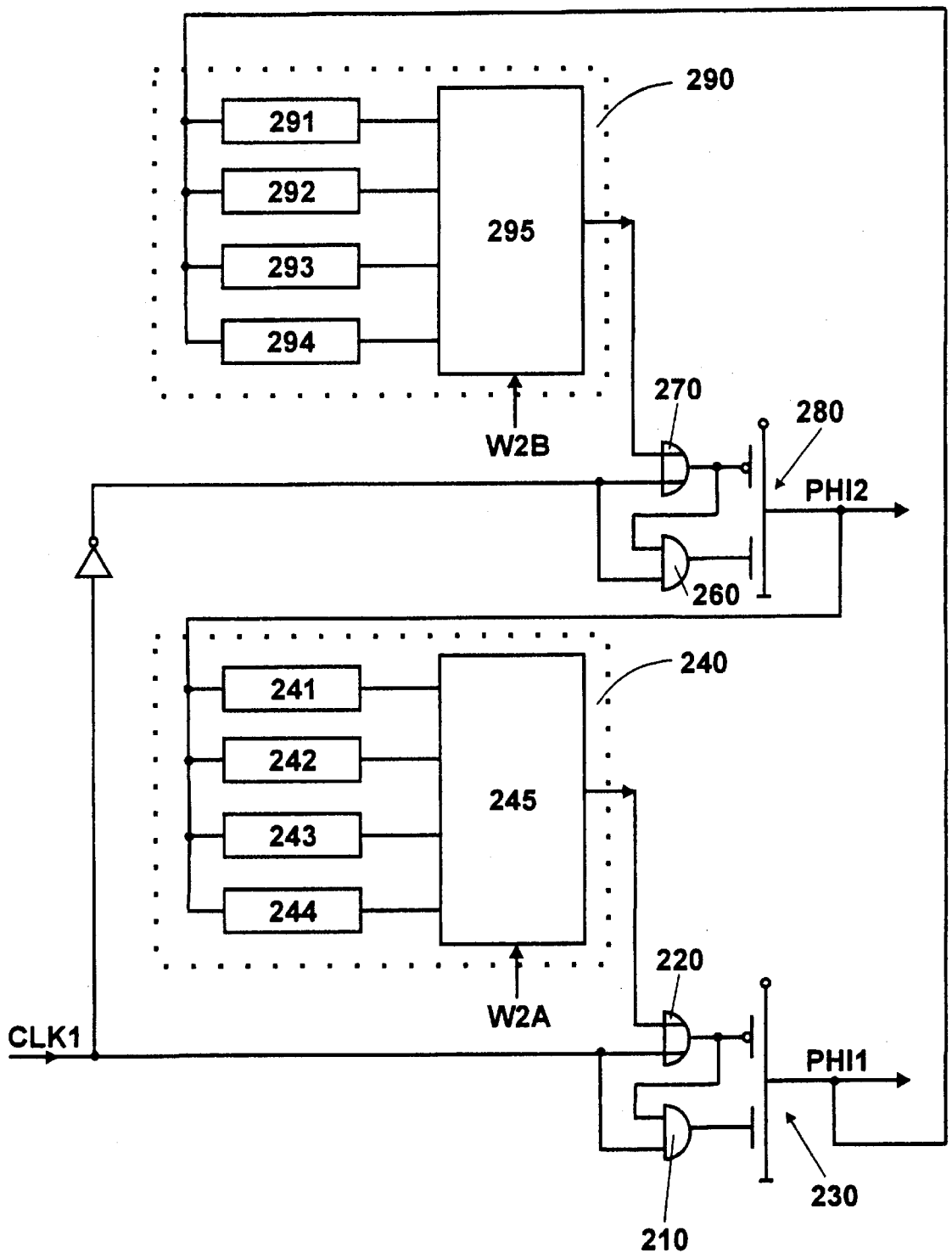
FIG. 3 is a schematic block diagram illustrating a possible embodiment of the second block 200 shown in FIG. 1.

The first sub-block comprises an AND gate 210, an OR gate 220, a transistor pair 230 (in this case, a pair of field-effect transistors) driven by the AND gate and the OR gate, and a delay stage 240, which are wired up as shown in FIG. 3.

The core element of the first sub-block in the circuit shown in FIG. 3 is the delay stage 240.

If this delay stage 240 were to be replaced by a continuous conduction element, the output signal PHI1 output from the first sub-block of the second block 200 would correspond exactly to the inverted input signal (intermediate clock signal) CLK1. This is because the transistor associated with the AND gate 210 outputs a low level when the output of the AND gate is at high level ("1"), and the transistor associated with the OR gate 220 outputs a high level when the output of the OR gate 220 is at low level ("0").

In contrast to this, as a result of the delay stage 240 being provided, the OR gate 220 can receive the input signal received from the delay stage offset in time such that the time of the high-level phase of the output signal from the OR gate is lengthened (this phase cannot be shortened because the second input signal of the OR gate 220 is the input signal CLK1 itself, which is input into the second block 200, and the minimum duration of the high-level phase of the output signal from the OR gate thus cannot be changed, i.e., it is defined such that it cannot be changed by the delay stage 240), with the result that the time for which the transistor associated with the OR gate is switched on, and therefore also the time for which the high-level voltage is switched through to the output PHI1, is noticeably shortened. Ultimately, providing the delay stage 240 in the first sub-block of the second block 200 thus causes the first output clock signal PHI1 to be influenced such that—in comparison with the case where no signal delay is provided—it rises to the high level later or drops to the low level sooner than is the case with the input signal CLK1.

The design of the second sub-block of the second block 200 is identical to that of the first sub-block. That is to say, the second sub-block has an AND gate 260 corresponding to the AND gate 210, an OR gate 270 corresponding to the OR gate 220, a transistor pair 280 corresponding to the transistor pair 230, and a delay stage 290 corresponding to the delay stage 240, which are wired up as shown in FIG. 3.

In contrast to the first sub-block, the signal input into the second sub-block is the inverted version of the signal CLK1 input into the first sub-block, i.e. CLK1, this version having been inverted by means of an invertor. Furthermore, the signals which are to be delayed by the delay stages 240 and 290 are different (PHI2 in the case of delay stage 240 in the first sub-block; PHI1 in the case of delay stage 290 in the second sub-block).

These differences do not change anything about the fundamental functional and operational correspondence between the first and the second sub-block, however.

As in the case of the first sub-block, the core element of the second sub-block in the circuit shown in FIG. 3 is also the delay stage 290.

If this delay stage 290 were to be replaced by a continuous conduction element, the output signal PHI2 output from the second sub-block of the second block 200 would correspond exactly to the inverse of the input signal CLK1, i.e. exactly to CLK1. This is because the transistor associated with the AND gate 260 outputs a low level when the output of the AND gate is at high level ("1"), and the transistor associated with the OR gate 270 outputs a high level when the output of the OR gate is at low level ("0").

In contrast to this, as a result of the delay stage 290 being provided, the OR gate 270 can receive the input signal received from said delay stage offset in time such that the time of the high-level phase of the output signal from the OR gate is lengthened (this phase cannot be shortened because the second input signal of the OR gate 270 is the signal CLK1 itself, which is input into the second sub-block, and the minimum duration of the high-level phase of the output signal from the OR gate thus it cannot be changed, more precisely is defined such that it cannot be changed by the delay stage 290), with the result that the time for which the transistor associated with the OR gate 270 is switched on, and therefore also the time for which the high-level voltage is switched through to the output PHI2, is noticeably shortened. Ultimately, providing the delay stage 290 in the second sub-block of the second block 200 thus causes the second output clock signal PHI2 to be influenced such that—in comparison with the case where no signal delay is provided—it rises to the high level later or drops to the low level sooner than is the case with the input signal CLK1.

Shortening the high-level phases (lengthening the low-level phases) of the output clock signals PHI1 and/or PHI2, whose waveforms are naturally inverse or complementary, that is to say without any delay stages, automatically causes a so-called overlap-free phase to be provided which did not exist initially and in which both the output clock signal PHI1 and the output clock signal PHI2 are in a low-level phase.

The circuit is preferably designed in such a way that a capacitor situated at the outputs PHI1/PHI2 automatically increases the overlap-free time, and the overlap-free times of the delay stages 240/290 may be combined with this cumulatively.

The extent to which the high-level phases of the output clock signals PHI1 and/or PHI2 are shortened (the low-level phases are lengthened) and the duration of the overlap-free phase obtained as a result are determined by the extent of the delay(s) by the delay stages 240 and/or 290. These delay stages are thus designed, according to the invention, such that they each have a multiplicity of delay elements 241 to 244 or 291 to 294, which are wired up in parallel, and a selection device in the form of a multiplexer 245 or 295. The plurality of delay elements 241 to 244 or 291 to 294 are designed in such a manner that they can be used to produce delays, for the signals input in each case, which can be defined as required but which are different from one another; in so doing, it may also be permitted in each case for a delay to be equal to zero, that is to say for there to be no delay. All the delay elements of a particular delay stage receive one and the same input signal, namely the signal PHI2 (delay elements of delay stage 240) or PHI1 (delay elements of delay stage 290). The signals input in each case are delayed by the respective delay element according to the respective delay, but are output otherwise unchanged as the respective output signal. The output signals from all delay elements 241 to 244 and 291 to 294 are input into the respective multiplexers 245 and 295. The multiplexers 245 and 295 can be used to select or determine, as a function of the control signals W2A and W2B supplied to them externally, which of the signals input into the respective multiplexers 245 and 295 is to be output as the output signal of the latter.

The control signals W2A and W2B input externally into the second block 200 or into its multiplexers 245 and 295 thus enable the duration of the overlap-free phase of the output clock signals PHI1 and PHI2 to be set or purposefully changed. They therefore permit, on their own or in conjunction with the duty ratio setting undertaken in the first block 100, the output clock signals PHI1 and PHI2 to be matched to the particular circumstances selectively, individually and in each case optimally.

As regards storage or other defining of the control signals W2A and W2B, more precisely their waveforms and/or values, reference is made to the corresponding statements about the control signals W1A and W1B.

The number of delay elements to be provided per delay stage can be defined as desired both in the first block and in the second block independently of one another. The extent of the delay, which is produced by the respective delay elements, can also be defined individually. In particular, as mentioned above, it is also possible to provide a "delay element" with the delay zero in each case.

It is naturally also possible to omit individual components of the clock generator described. The components to be omitted may be a whole block as shown in FIG. 1, or alternatively "only" selected individual or numbers of multiplexers, including any signal paths which are then superfluous, as shown in FIGS. 2 and/or 3.

In the exemplary embodiment described, it has been assumed that the rising edges or the high-level phases of the respective output clock signals are the events or phases which trigger an event in the equipment to be driven by these signals. Instead of this, it is naturally also possible for the falling edges or the low-level phases of the respective output clock signals to be the events or phases which trigger an event in the equipment to be driven by these signals; the circuit described then needs to be modified accordingly, particularly as regards setting the overlap-free phase in the second block 200. Those skilled in the art are quite enabled to implement such a modification without any detailed explanation.

We claim:

1. A clock signal generator, comprising:

a clock input;

a first logic configuration having an input receiving an intermediate clock signal and outputting a first clock output signal;

a second logic configuration having an input receiving the intermediate clock signal and outputting a second clock output signal;

the first and second clock output signals having a programmable duty ratio and a programmable overlap-free time;

a first delay stage with a selectable delay connected to receive the second clock output signal and to supply the second clock output signal to said first logic configuration;

a second delay stage with a selectable delay connected to receive the first clock output signal and to supply the first clock output signal to said second logic configuration;

a third delay stage with a selectable delay, said third delay stage having an input connected to said clock input; and a third logic configuration having an input connected to said clock input and outputting the intermediate clock signal to said input of said first logic configuration and to said input of said second logic configuration.

2. The clock signal generator according to claim 1, which further comprises a multiplexer for selecting a delayed signal, said multiplexer being connected to a multiplicity of mutually parallel delay paths and being controllable by an external control signal.

3. The clock signal generator according to claim 1, which further comprises a multiplicity of mutually parallel delay paths, and wherein a delayed signal is selectable by modifying a wiring of said multiplicity of delay paths.

4. The clock signal generator according to claim 1, further comprises a circuit with a multiplicity of mutually parallel delay paths, and wherein a delayed signal is selectable by subsequently breaking wiring connections in said circuit with said multiplicity of delay paths.

5. The clock signal generator according to claim 4, wherein said wiring connections are broken by means of a laser beam.

6. The clock signal generator according to claim 1, wherein said third logic circuit has an AND gate and an OR gate each having a first input receiving the clock input signal and a second input receiving the signal delayed in said third delay stage, and wherein the intermediate clock signal is selectively tapped off at an output of said AND gate and an output of said OR gate.

* * * * *